United States Patent [19]

Swart et al.

[11] Patent Number: 5,321,351
[45] Date of Patent: Jun. 14, 1994

[54] TEST FIXTURE ALIGNMENT SYSTEM

[75] Inventors: Mark A. Swart, Upland; Charles J. Johnston, Walnut; David R. Van Loan, Diamond Bar, all of Calif.

[73] Assignee: Everett Charles Technologies, Inc., Pomona, Calif.

[21] Appl. No.: 648,453

[22] Filed: Jan. 31, 1991

Related U.S. Application Data

[63] Continuation-in-part of Ser. No. 528,957, May 25, 1990, abandoned.

[51] Int. Cl.⁵ ............................................. G01R 15/12
[52] U.S. Cl. ............................ 324/158 F; 324/158 P; 348/135
[58] Field of Search .............. 324/158 F, 158 P, 72.5, 324/73.1; 439/482; 358/101, 107; 356/399, 400, 401; 382/8; 33/645

[56] References Cited

U.S. PATENT DOCUMENTS

| | | | |
|---|---|---|---|
| 4,668,982 | 5/1987 | Tinnerino | 358/101 |
| 4,820,975 | 4/1989 | Diggle | 358/107 |
| 4,922,434 | 5/1990 | Fule | 358/101 |
| 4,943,767 | 7/1990 | Yokota | 324/158 F |
| 4,962,423 | 10/1990 | Yamada et al. | 358/101 |

*Primary Examiner*—Vinh Nguyen
*Attorney, Agent, or Firm*—Christie, Parker & Hale

[57] ABSTRACT

A test fixture for testing printed circuit boards includes an array of test probes held in contact with a pattern of test points in a circuit array printed on the circuit board. The circuit array is positioned on the board with respect to a fiducial mark on the board, and a tooling pin hole on the board is aligned with the circuit array. The fixture includes a tooling pin inserted in the tooling pin hole to hold the circuit array in a fixed position relative to the test probes during testing. The fiducial mark is sensed, and an optical reading shows the alignment or misalignment of the test points on the board relative to the probes. The tooling pin is adjusted on the fixture to move the board relative to the probes to correct misalignment. The optical reading indicates movement of the tooling pin and board to a corrected position necessary to align the circuits on the board to the probe field. The alignment of the board on the fixture can be optically sensed by a lens system, fiber optic image conduit, light source, an image enlarger and video probe, removable from the fixture base, that produces images of the fiducial mark and a known zero reference point on a TV monitor. The zero reference is adjustable electronically during calibration. Alignment of the fiducial mark image to the reference point image produces precise alignment of the test probes and the circuit array.

35 Claims, 9 Drawing Sheets

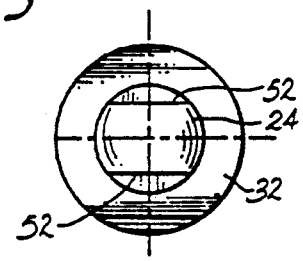
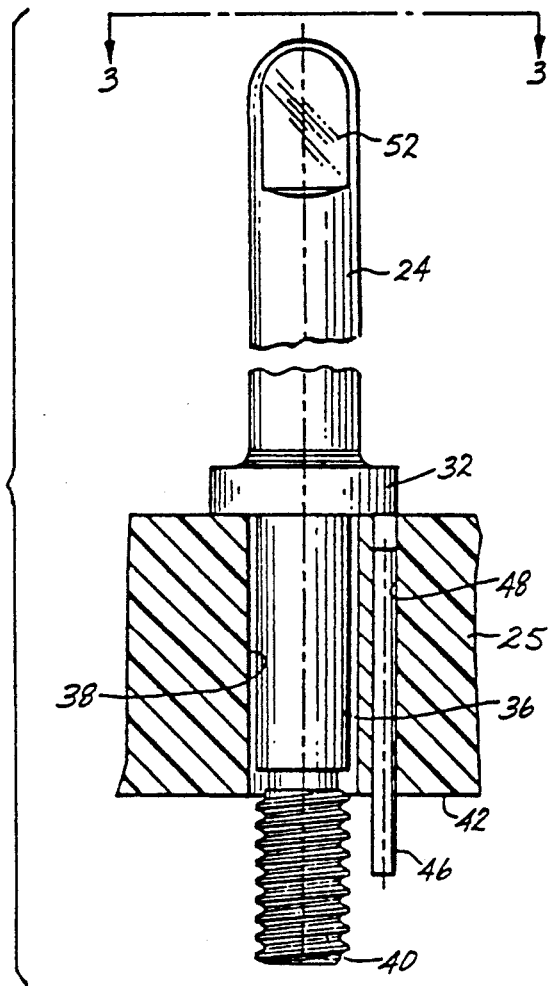
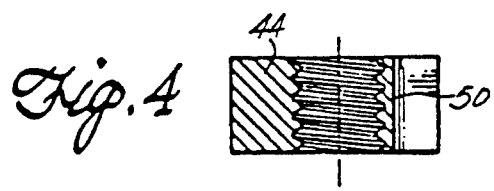
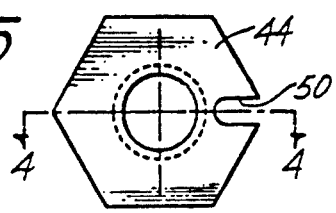

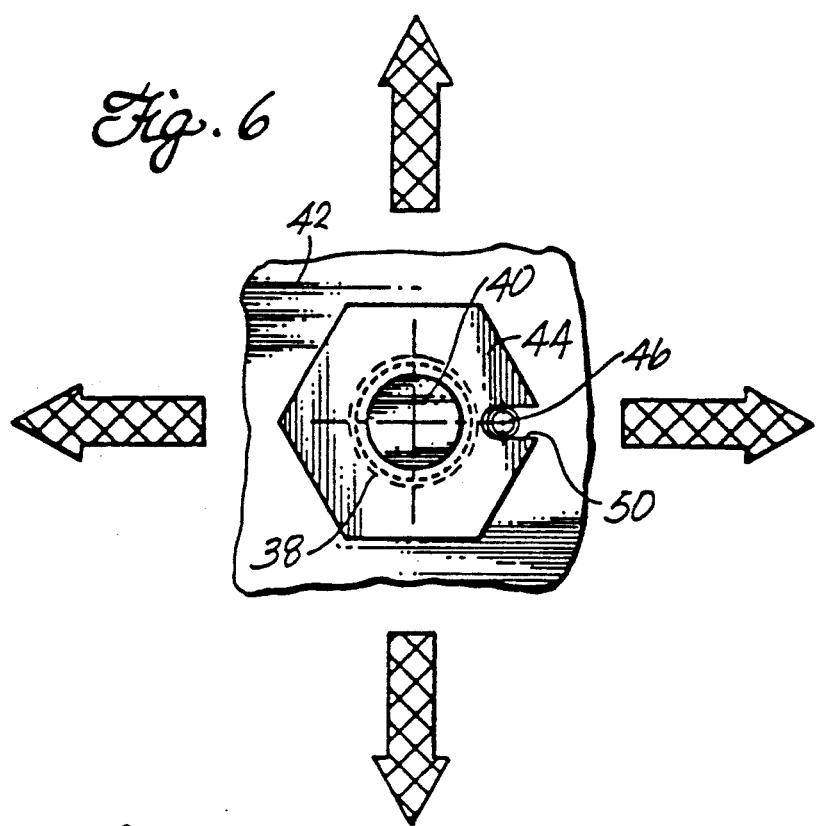
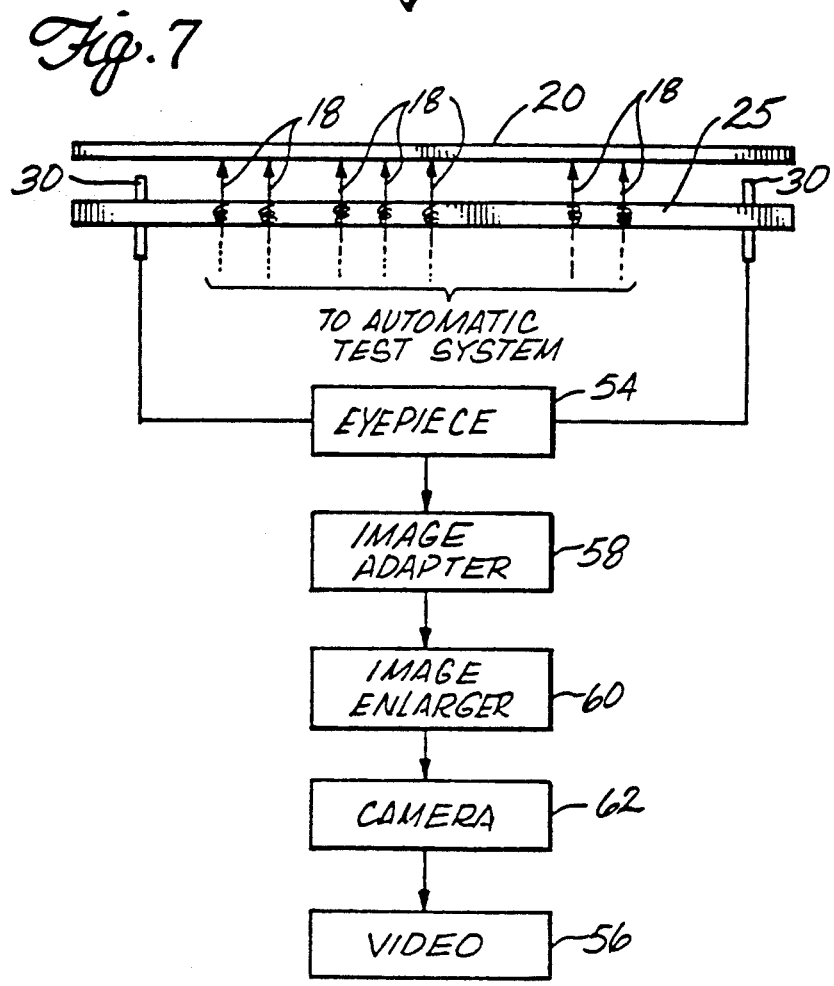

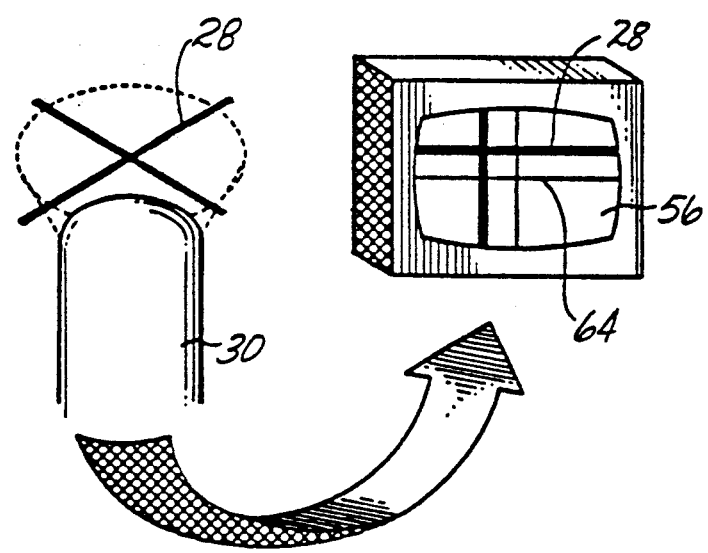

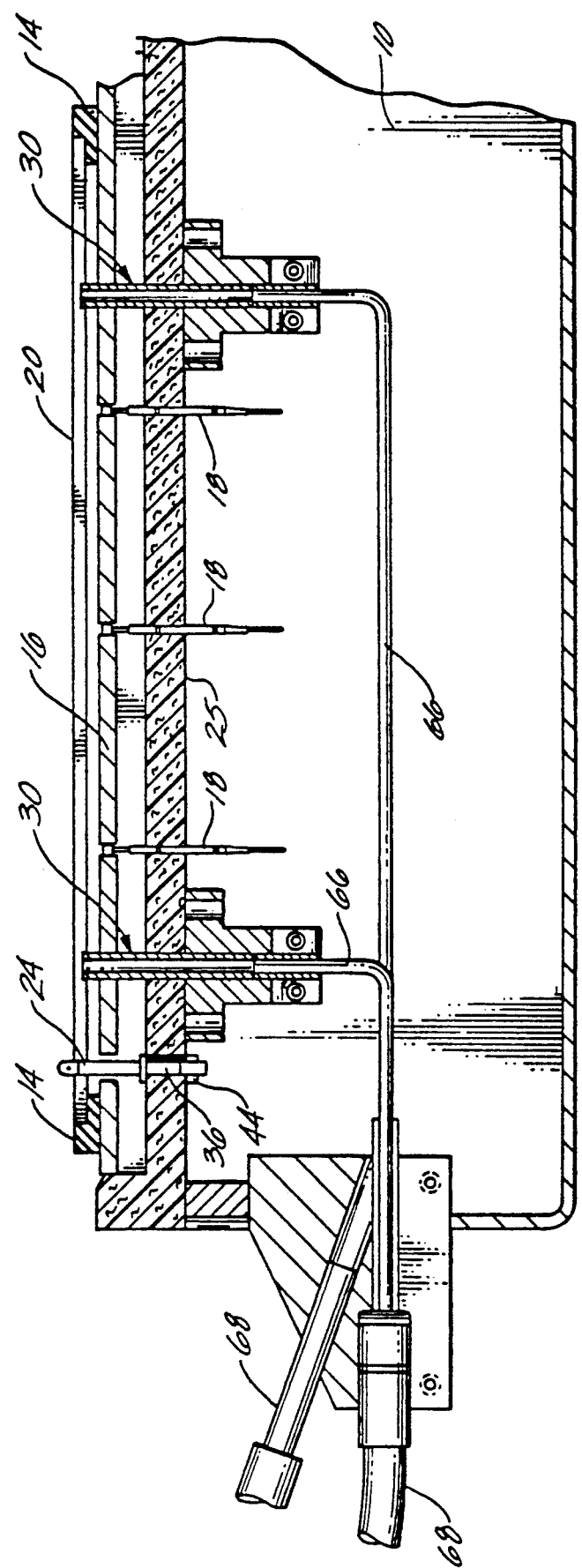

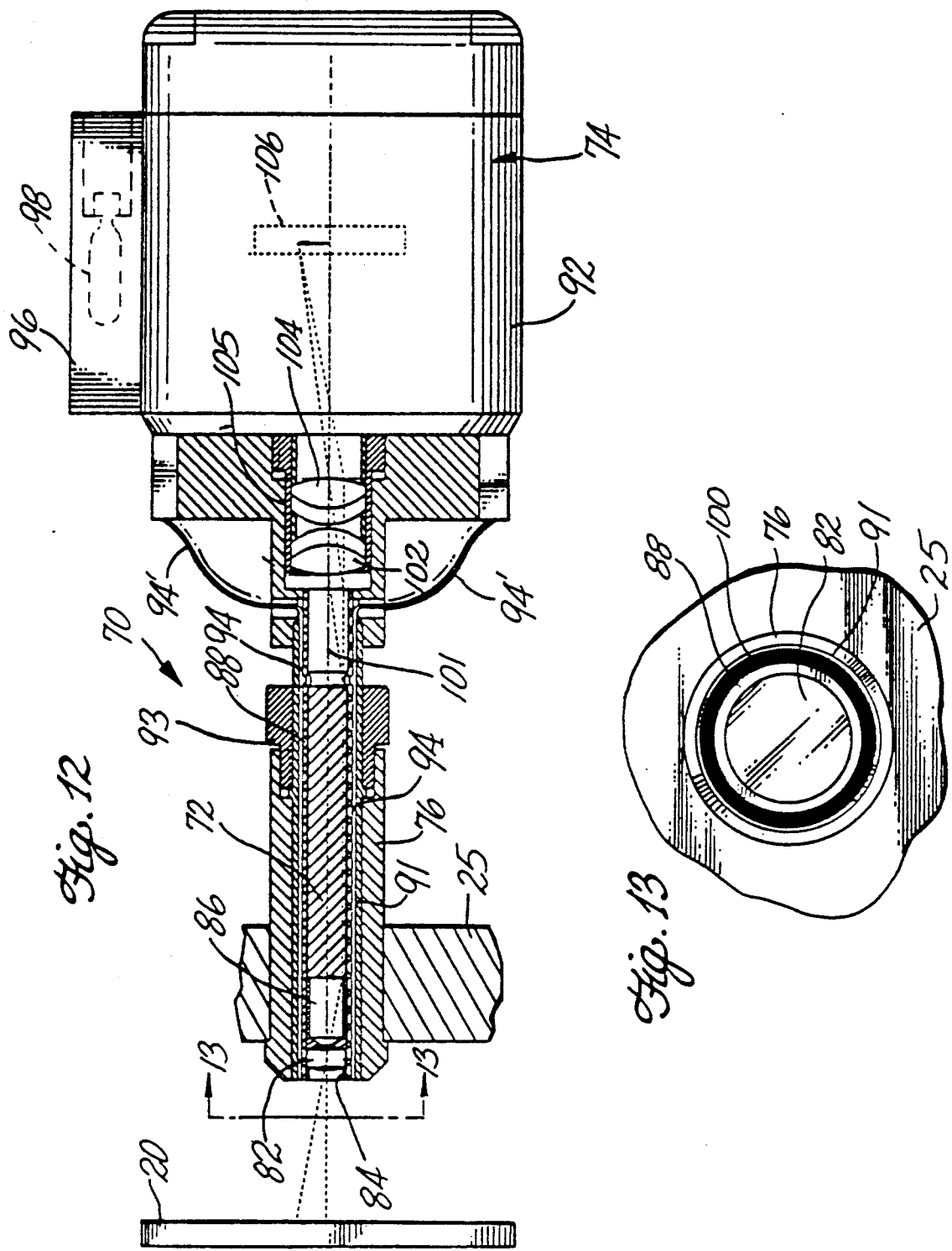

TEST FIXTURE ALIGNMENT SYSTEM

CROSS-REFERENCE

This is a continuation-in-part of application Ser. No. 07/528,957, filed May 25, 1990, now abandoned.

FIELD OF THE INVENTION

This invention relates generally to the field of automatic test equipment, and more particularly, to a system for aligning printed circuit boards with a test fixture used in the automatic testing of circuit boards.

BACKGROUND OF THE INVENTION

In the automatic testing of printed circuit boards, conventional spring-loaded test probes are typically mounted on a test fixture, and the circuit board under test is held in pressure contact with the spring probes to provide electrical contact between diagnostic or testing equipment and circuits on the board under test. Each test fixture typically contains a base or probe plate having an array of spring probes dedicated to the board under test. Identical circuit boards are then aligned with the fixture and tested, one at a time, to determine whether there are any defects in the circuits printed on each board.

During testing, the spring probes must be correctly aligned with test points in the circuits printed on the board under test. This requires correct alignment of the board on the fixture so that the spring probes are automatically registered with corresponding test points in the circuit array printed on each board. In order to align the board with the probes, the customary practice has been to first drill tooling pin holes in the circuit board. Drilling is done by the board manufacturer, and usually a pair of tooling pin holes are drilled in diagonally opposite corners of the board. During testing, tooling pins in opposite corners of the fixture are positioned in corresponding tooling pin holes to automatically align the board with the array of test probes on the fixture. This procedure requires that the tooling pin holes be drilled accurately in the board by the board manufacturer, so that when each board is later mounted on the tooling pins, the test probes will automatically register with the circuits printed on the board when the test probes are brought into pressure contact with the board during testing.

Printed circuit boards made by a given manufacturer are usually produced in lots, and boards within a given lot will tend to produce a certain misalignment, from tolerance error, when boards within that lot are mounted on a fixture. Alignment tolerances will tend to vary from lot to lot with a given manufacturer. The same board made by a different manufacturer also tends to have different tolerance variations and misalignment errors from lot to lot.

Printed circuit boards typically have a pair of "fiducial marks" printed in the margin of the board at known reference positions relative to the circuit array or "artwork" printed on the board. The fiducial marks are printed on the board by the board manufacturer, and the fiducial marks are used as a guide for the manufacturer's drilling of the tooling pin holes at locations on the board that will automatically align (hopefully) the board to the test probes when the board is mounted on the tooling pins.

There are drawbacks to using these procedures for aligning a printed circuit board with a test fixture. Mechanical tolerances are involved in (1) positioning of the drilling tool in the drilling machine, (2) positioning of the tooling pin holes drilled in the printed circuit board with respect to the artwork on the board, and (3) positioning of the tooling pins on the fixture with respect to the tooling pin holes in the board. Because of these tolerance accumulations, the test probes often do not precisely register with the test points in the circuit array printed on the board. This problem is magnified by tolerance variations in board lots from different manufacturers. The problem also is compounded by advances in the art of printed circuit board technology, where printing of circuits with finer lines and narrower circuit spacings requires more accurate registration of the test probes with the circuits under test. At the present time, for example, it is common for test probes to be misaligned within a range of 0.005 to 0.008 inch in a typical test fixture; more accurate alignment is desirable, and the present invention provides techniques for achieving greater alignment accuracy.

SUMMARY OF THE INVENTION

Briefly, the present invention provides a system for accurately positioning a printed circuit board on a test fixture so that a pattern of test points in a circuit array printed on the board is precisely registered with an array of corresponding test probes on the fixture. Advantages of the alignment system include its ability to produce extremely accurate alignment quickly and easily, low manufacturing costs, reduced time and cost involved in the internal alignment (calibration) of the fixture's system components, and interchangeability with different fixtures.

One embodiment of the invention provides a test fixture for testing printed circuit boards in which the fixture is the type having an array of test probes held in contact with a pattern of test points in a circuit array printed on the board. The circuit array is positioned on the board with reference to a fiducial mark or other reference point on the board. A tooling pin hole or other alignment device on the board is positioned on the board with reference to the circuit array. In one embodiment, the tooling pin hole is positioned on the board with respect to the circuit array, using the fiducial mark as a positioning guide for the drilling tool. The test fixture includes a tooling pin for registering with the tooling pin hole or other alignment device on the board to hold the printed circuit array in a fixed position relative to the test probes on the fixture. The fiducial mark is sensed by sensing means on the fixture for producing an output which represents the alignment or misalignment of the test probes on the fixture with respect to corresponding test points in the circuit array on the board. The position of the tooling pin on the fixture is adjustable to move the board relative to the fixture and thereby correct misalignment of the test probes relative to the circuit array on the board. The sensing means output indicates the amount and direction of movement of the tooling pin and board to a corrected position on the fixture necessary to precisely align the test probes with the circuit array on the board. The tooling pin is then locked in its corrected position for holding the printed circuit board in its properly aligned position on the fixture.

In one embodiment of the invention, the fiducial mark (or any other indexing reference on the board) is sensed by optical sensing means which can comprise a bore scope, an optical fiber image sensor, or a lens system and video probe assembly.

The lens system and video probe may be used with or without the optical fiber image sensor which conveys an image of the fiducial mark to the lens system and video probe.

A visual reading of the alignment or misalignment can be produced by an optical system having means responsive to the optical sensor for producing an enlarged image of the fiducial mark. Display means within the optical system also produce an image of a reference mark that provides a calibrated known zero reference point which, when compared with the enlarged image of the fiducial mark, produces an indication of the alignment or misalignment of the test probes relative to the circuit array on the board. In one embodiment the zero reference point is adjustable so it can be calibrated into the display system independently of the system optics. During use, the tooling pin and board are moved relative to the fixture, while observing the display images of relative movement between the fiducial mark and the reference mark, so that optical alignment of the two marks precisely registers the test probes on the fixture with corresponding test points in the circuit array on the board.

In one form of the invention, a visual display of the alignment or misalignment of the board is produced by a miniature video camera system mounted to the fixture. Preferably, there are at least two video camera systems mounted below opposite corners of the circuit board. In one embodiment, the video cameras and their image-conveying optical systems are removable from the fixture to enhance interchangeability from fixture to fixture. Each video camera has optical means focused upon a corresponding fiducial mark on the board, and each video camera has its output coupled to a video monitor. A reference index display, preferably obtained from a cross-hair generator or the like, superimposes the reference index on the image of the fiducial mark displayed on the video monitor. The reference index display is set at a calibrated known zero position representing precise alignment of the artwork on the board with respect to the test probe field. Changing the position of the movable tooling pin moves the board, causing the image of the fiducial mark to move on the display relative to the cross-hair. Alignment of the fiducial mark with the cross-hair on the video monitor automatically produces precise alignment of the board to the probe field on the fixture. This calibration is achieved independently of system optics.

In one embodiment, the video camera lens system has a surrounding light source produced by optical fibers for illuminating the fiducial mark on the board being aligned. The camera lens system produces an image of the illuminated fiducial mark which is transmitted by an optical fiber conduit and focusing lens to a video camera and converted to an enlarged video image display, which enhances accuracy of the alignment procedure.

Another form of the invention provides a reference board having artwork representative of circuits on the board under test. This form of the invention avoids use of means for enlarging the image of a fiducial mark or other board reference point. The reference board is preferably first aligned to the test fixture so the artwork on the reference board is perfectly aligned with the array of test probes on the fixture. A board under test then can be overlaid on the reference board to align the artwork on the board under test with the artwork on the reference board. The two boards are then affixed to one another to prevent relative movement between them, and the reference board is then aligned with the fixture. Movable tooling pins on the fixture are moved to a position in alignment with tooling pin holes or other alignment devices on the board under test. The tooling pins are locked, the reference board is removed, and the artwork on the circuit board under test is then automatically aligned with the probe field on the fixture. Circuit boards within the same manufacturer's lot then can be mounted to the fixture for testing, using the adjusted positions of the tooling pins for alignment of the board.

The present invention provides accurate means for aligning the test probes with the circuits on the board such that tolerance accumulations prevalent in the prior art testing procedures are greatly reduced, resulting in greatly improved testing accuracy. The circuit board alignment system also is reasonably inexpensive to manufacture and easily and accurately used by those involved in the testing of circuit boards. Since the zero reference calibration system is independent of system optics, calibration procedures are handled quickly and easily and at a reasonably low cost. The optical system and calibration techniques also are easily interchangeable with different fixtures.

These and other aspects of the invention will be more fully understood by referring to the following detailed description and the accompanying drawings.

BRIEF DESCRIPTION OF THE DRAWINGS

FIG. 2 is a fragmentary cross-sectional view illustrating an adjustable tooling pin mounted on the fixture.

FIG. 3 is a top view taken on line 3—3 of FIG. 2.

FIG. 4 is a cross-sectional view taken on line 4—4 of FIG. 5 and showing a locking nut for the adjustable tooling pin.

FIG. 5 is a top view of the locking nut.

FIG. 6 is a diagrammatic representation of means for adjusting the tooling pin and means for locking the tooling pin with the locking nut.

FIG. 7 is a schematic diagram illustrating components of an optical system for amplifying and displaying means for aligning a circuit board with test probes on the fixture.

FIG. 8 is a schematic representation illustrating visual indications of indexing means for use in aligning the printed circuit board to the fixture.

FIG. 9 is a fragmentary cross-sectional view illustrating one embodiment of a test fixture containing an optical test fixture alignment system.

FIG. 12 is a semi-schematic cross-sectional view illustrating components of a miniature video camera system for imaging test fixture alignment.

FIG. 13 is an elevation view taken along 13—13 of FIG. 12.

DETAILED DESCRIPTION

Figure 1:
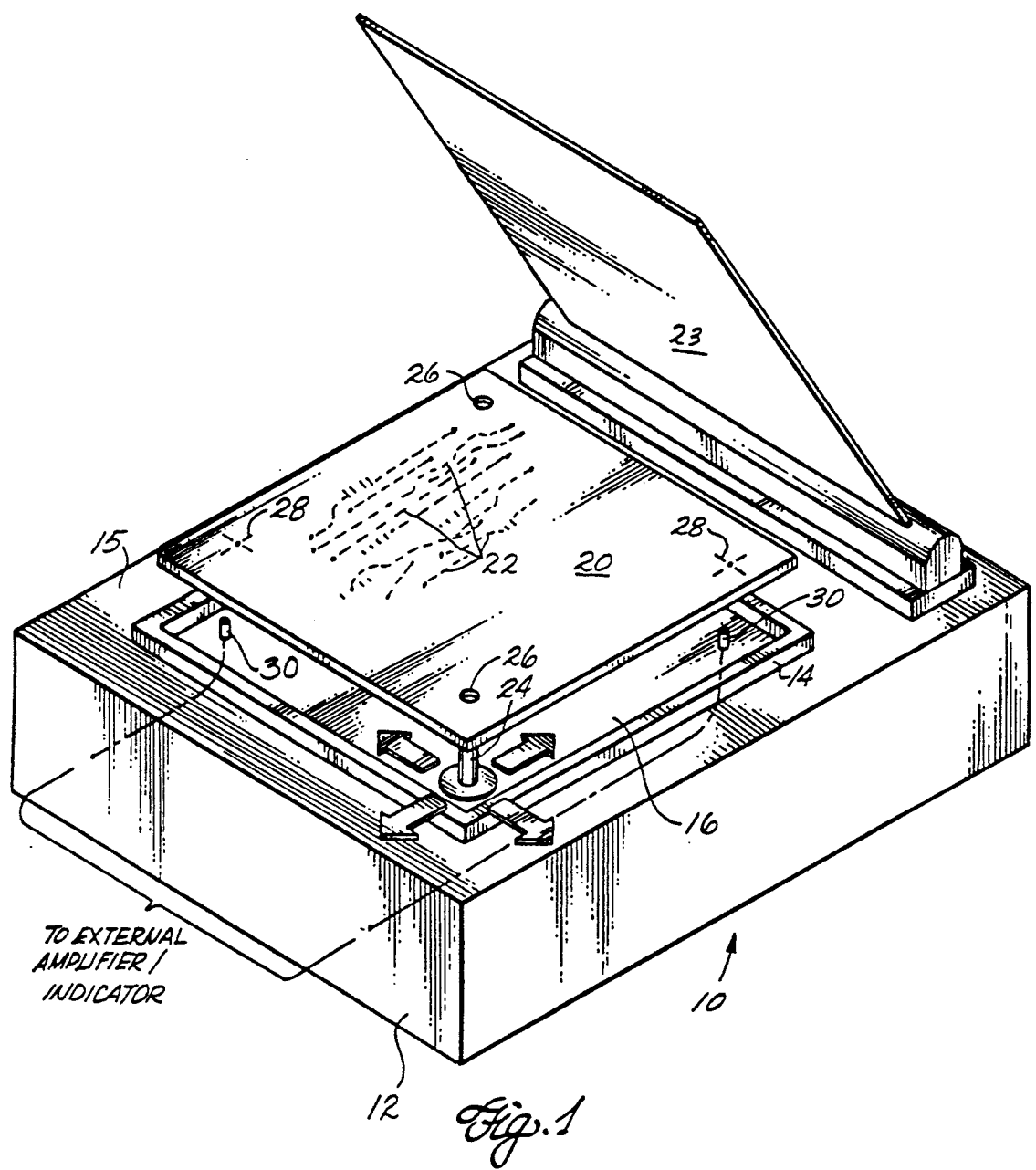
FIG. 1 is a perspective view illustrating a test fixture with an adjustable alignment system according to principles of this invention.
Figure 10:
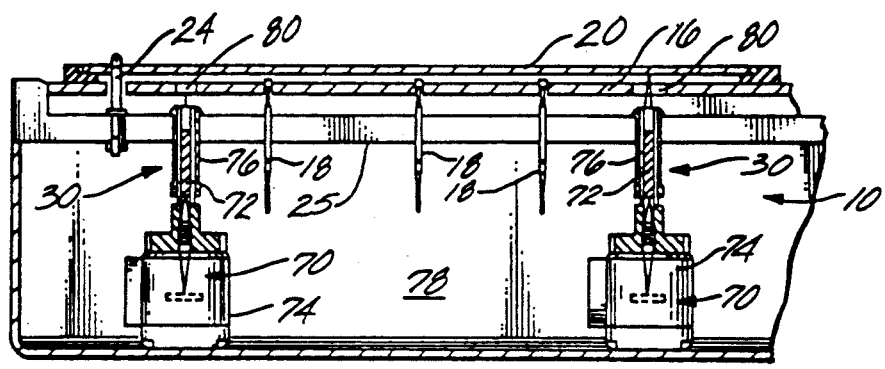
FIG. 10 is a fragmentary cross-sectional view illustrating an alternative embodiment of the test fixture containing a video camera in an optical test fixture alignment system.
Figure 11:
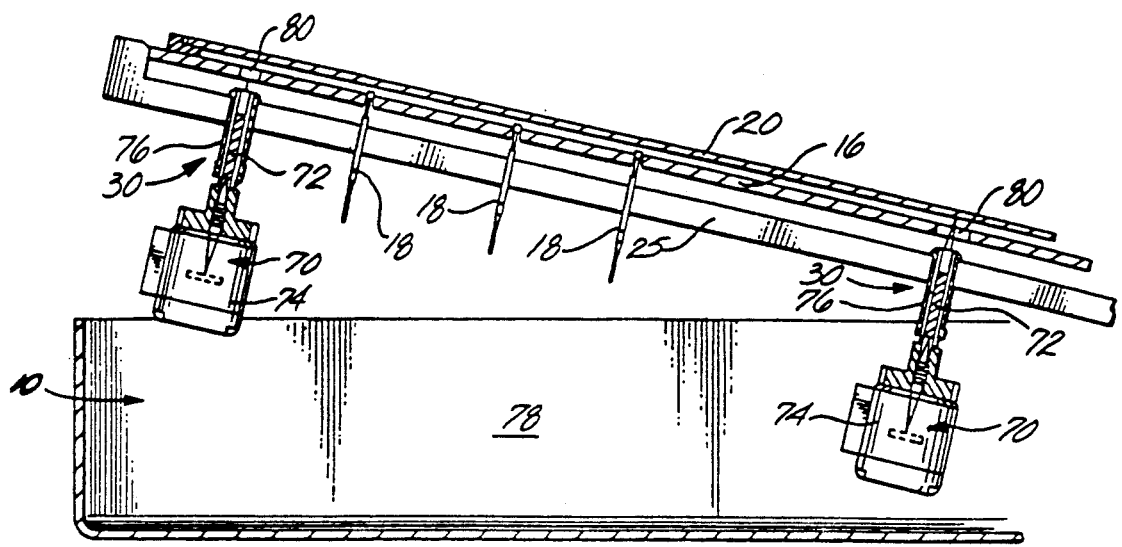
FIG. 11 is a fragmentary cross-sectional view similar to FIG. 10, but showing the fixture rotated to an open position.

FIG. 1 illustrates a test fixture 10 which can represent any test fixture of the type used in the automatic testing of printed circuit boards. In the illustrated embodiment, the fixture includes a housing 12 and a rectangular compressible gasket 14 mounted on an upper face 15 of the housing. The rectangular gasket mounts a circuit board 20 to the fixture and defines the exterior peripheral boundary of a region within the fixture that mounts an array of spring-loaded test probes 18. The probes are represented schematically in FIG. 7 and are also shown in FIGS. 9-11. The test probes are mounted in a desired pattern on a probe plate 25 within the fixture to match the pattern of test points in circuits printed on the circuit board 20 under test. The printed circuit board includes a printed circuit array 22 formed by conventional artwork techniques. In the illustrated embodiment, the circuit array 22 is printed on an underside of the board which faces an array of test probes that project through holes in a movable top plate 16. The gasket 14 is mounted to the top of the moving top plate 16 as shown best in FIG. 9. The moving top plate holds the circuit board 20 parallel the array of test probes. Individual test points within the circuit array 22 on the board are contacted by corresponding test probes during automatic testing of the circuits on the board.

In a preferred test fixture arrangement, the probe plate 25 and the moving top plate 16 are drilled with holes on a pattern that matches the test points in the circuit array on the board under test. The test probes are then mounted in the pattern of holes on the probe plate. The test probes project up through the holes in the moving top plate 16, which is spring-mounted to the probe plate 25. The drilled probe plate and the top plate are dedicated to a particular board under test, and identical circuit boards are tested one-by-one on the fixture. To test a different circuit board, a new probe plate and moving top plate are drilled with a new hole pattern, and a new array of probes are used for testing the board on what otherwise is the same fixture.

Although the invention is described with reference to circuit boards having an array of printed circuits, such as "bare boards" as they are known in the art, the fixture alignment system of this invention also can be used for testing "loaded circuit boards" to which circuit components, such as integrated circuit packages and the like, are mounted.

Once the printed circuit board 20 is mounted on the fixture, a hinged door 23 is closed over a cavity containing the circuit board, and vacuum pressure is applied to resiliently bias the spring probes into contact with corresponding test points in the circuit array printed on the board, in a manner familiar to those skilled in the art. A typical means of applying pressure can be through vacuum applied to the cavity to seal the board 20 to the gasket 14 during testing. The vacuum draws the board and the moving top plate 16 down toward the array of test probes 18 on the probe plate 25. Continuity or lack of continuity between the various test points in the electrical circuits on the board are detected by an external electronic test analyzer (not shown) electrically coupled to the test probes for use in measuring whether the circuit board is functional or for identifying defective circuits.

During testing, a pair of movable tooling pins 24 mounted in diagonally opposite corners of the probe plate 25 are registered with corresponding tooling pin holes 26 drilled in diagonally opposite corners of the circuit board 20. (Only one of the movable tooling pins is shown in FIG. 1; the other is obscured by the printed circuit board.) By positioning the tooling pins in the tooling pin holes, the board is mounted in a fixed position parallel to the fixture base, so that the test points in the circuit array 22 can be automatically aligned with corresponding test probes 18 for testing the circuits on the board. Use of tooling pins inserted in the tooling pin holes is one example of a means for mounting the board to the fixture. Alternatively, tooling pins on the fixture can be engaged with other alignment devices on the board to hold the board in a fixed position as the fixture. One example is a tooling pin with a right angle recess that engages a right angle corner of a board. Other means of aligning the board to the fixture are possible.

As mentioned previously, the tooling pins do not necessarily produce the desired precise alignment. The tooling pin holes are drilled in the board by the board manufacturer. Fiducial marks 28 are printed on the board by the board manufacturer, and these marks, shown in diagonally opposite corners of the board, provide a known reference point or indexing mark with respect to the artwork printed on the board. (The fiducial marks shown on the top side of the board in FIG. 1 are actually visible from the underside of the board.) The board manufacturer aligns the drilling tools with respect to the artwork on the board, using the fiducial marks as a reference, and the tooling pin holes are positioned (drilled) on the board with reference to the fiducial marks. However, in practice, mechanical tolerance accumulations are generated from positioning the board in the drilling machine, positioning the drilling tools in the drilling machine, drilling the tooling pin holes, and registering the tooling pins on the fixture with the drilled tooling pin holes. Thus, the tooling pin holes drilled in the board may not precisely register the spring probes with the artwork on the board when the tooling pins are inserted in the tooling pin holes and the board is brought into pressure contact with the probes.

The fixture 10 provides means for overcoming the drawbacks of the conventional practice of aligning a circuit board under test with a test fixture. The fixture 10 includes an alignment system having a means for movably positioning the tooling pins 24 on the probe plate 25, together with sensors 30 on the probe plate for use in sensing the position of the fiducial marks 28 on the board under test. The movable tooling pins allow the board to be moved manually relative to the probe field on the fixture. The sensors detect movement of the fiducial marks as the printed circuit board is moved into alignment with the probe field, and an enlarged image of each fiducial mark is displayed to assist in precise manual alignment of the board to the probes on the fixture. The fiducial marks are sensed by the sensors 30, and images of the marks are produced and are observable in relation to an image of a corresponding known zero reference point used as a reference index in an optical alignment and display system. The tooling pins 24 are manually movable to move the board while observing corresponding movement of the fiducial mark on the display, so the board can be moved to accurately align each fiducial mark 28 with a displayed reference point. This movement automatically positions the test points in the circuit array 22 in precise alignment with corresponding spring probes on the fixture base. FIGS. 2 through 6 illustrate a preferred system for adjustably mounting the tooling pins to the fixture base. Separately, the sensors 30 are mounted in fixed positions on the fixture base in diagonally opposite corners and in alignment with the fiducial marks 28 or any other indexing marks of the board under test. The sensors 30 and the reference indexing and optical alignment system are described in more detail below.

Referring now to FIGS. 2 through 6, adjustment of the tooling pin positions will now be described. Each tooling pin 24 comprises a rounded upright board-locating pin with an enlarged rounded base 32 having a flat annular bottom surface 34. The diameter of the tooling pin matches the diameter of the tooling pin hole drilled in the board so the board can be positioned on the tooling pin. An elongated cylindrical shank portion 36 of a pin fastening member extends downwardly from the underside of the rounded base 32. The shank has an outside diameter similar to the outside diameter of the tooling pin, and the axis of the shank is aligned with the vertical axis through the tooling pin. The shank is positioned in a mounting hole 38 in the probe plate or fixture base 25. The mounting hole is oversized relative to the outside diameter of the shank, so the shank portion of the locating pin can have 360° freedom of movement within the fixture hole. During this movement, the rounded base 32 of the locating pin completely covers the hole and provides a support base for holding the tooling pin at all times in a vertical upright position. The bottom of the pin fastening member has an externally threaded section 40 that projects down from a bottom face 42 of the fixture base. The tooling pin is held in place in the fixture base by an internally threaded locking nut 44 tightened onto the externally threaded bottom section 40 of the fastening system. By rotating the locking nut onto the projecting bottom portion of the fastening member during assembly, the tooling pin can be held in a fixed orientation with respect to the top plane o the fixture base.

During assembly, and after the locking nut has been tightened against the bottom face of the fixture, a dowel pin 46 is then placed in a narrow passageway 48 in the fixture bottom adjacent the shank portion 36 of the tooling pin 24. The dowel pin is preferably adhesively bonded or otherwise rigidly affixed in the passageway to hold the dowel pin in a fixed position, with a lower portion of the dowel pin projecting from the bottom face 42 of the fixture base, adjacent the locking nut 44. The projecting lower portion of the dowel pin is contained within a narrow recess 50 in the locking nut. The tooling pin 24 is movable relative to the fixture base by engaging the flats on a wrench (not shown) with flats 52 at the top of the tooling pin, and by turning the wrench to rotate the tooling pin about its axis. This loosens the tooling pin from its fastened connection to the locking nut and allows the entire tool pin assembly to be moved in any direction within the hole 38 relative to the fixture base. Once the tooling pin has been moved to a desired position, the tooling pin then can be locked to the base by turning the tooling pin, using the wrench applied to the flats 52 from access provided above the fixture base. The dowel pin 46 engages the recess 50 in the locking nut 44 to prevent rotation of the locking nut as the tooling pin is being tightened to its locked position. The upper portion of the tooling pin 24 extends through an oversized hole in the top plate 16 (see FIGS. 9 and 10) so the tooling pin can be moved on the fixture base (probe plate 25) without moving the top plate when the board is moved.

Alignment of the printed circuit board to the array of test probes will now be described. The sensors 30 comprise any type of sensing device that can sense the location of the fiducial marks 28 on the board and provide an output signal representative of the sensed position of the fiducial marks. Since the fiducial marks are printed at known reference positions relative to the artwork printed on the board, the fiducial marks provide a precise reference point with respect to the locations of the test points within the circuit array printed on the board. The sensors 30 preferably comprise optical sensors which optically sense the positions of the fiducial marks and produce an output which is processed by an external image enlarger and display system that amplifies and displays enlarged images of the positions of the fiducial marks relative to corresponding known zero reference points which are also displayed.

In a preferred alignment technique, a known zero reference is first established. Preferably, a reference board known as a "gold board" is used to set the zero reference. The gold board is a replica of a printed circuit board having its fiducial marks (or other indexing marks) perfectly set to positions on the board with reference to the position of the artwork on the board. The gold board preferably has two fixture pins, referred to as "gold pins," in its opposite corners to represent the perfectly set fiducial marks. The gold board also has fixed tooling pins positioned on the gold board for perfect alignment of the gold board to the fixture. The gold board is mounted on the fixture by inserting the tooling pins of the gold board into fixed tooling pin holes on the fixture, which correctly aligns the gold board to the fixture. This produces perfect alignment of the fiducial marks (the gold pins) on the gold board with the fixture and its probe field. (The gold board has clearance holes for receiving the movable tooling pins 24 so the gold board can be mounted to the fixture independently of the location of the tooling pins 24. No circuits are printed on the gold board since the gold board is used only for alignment purposes.) The sensors 30 are then used for sensing the positions of each gold pin and displaying an enlarged image of the gold pin on a display or monitor. The images of the gold pins are preferably displayed on separate monitors, although they could be displayed together on one monitor. Separately, a cross-hair generator is used to form a cross-hair image on the display to represent a perfect zero alignment of the board to the fixture. A separate cross-hair image is superimposed over the image of each gold pin displayed on the monitor. The optical sensing system is then aligned to the gold pins on the gold board using the images displayed on the monitor. The gold board remains fixed with respect to the fixture and the images of the cross-hairs are moved electronically until each cross-hair registers perfectly with the enlarged image of a corresponding gold pin displayed on the monitor. This precisely aligns the image display system to each fiducial mark (the gold pins) on the gold board, so that the settings of the cross-hair zero points represent perfect alignment of the artwork on the circuit board related back to the probe field on the fixture. The gold board is then removed from the fixture. Thereafter, circuit boards placed on the fixture tooling pins are aligned with the zero-tolerance-error reference points represented by the images of the cross-hairs on the monitor. When a circuit board is first placed on the fixture, any misalignment of the artwork relative to the probe field is represented by a misalignment of each fiducial mark relative to its corresponding cross-hair zero point that represents zero tolerance error. The movable tooling pins are then loosened, the board is moved manually, and the monitor is observed to align each sensed fiducial mark with its corresponding cross-hair reference. This automatically and precisely aligns the artwork on the board to the array of probes on the fixture.

The separate calibration board (gold board) and electronically adjustable cross-hair generator calibrate alignment of the fixed zero reference point to the fiducial mark imaging system, independently of system optics. This greatly reduces the cost of the alignment system when compared with a system in which the fixed reference is built into a lens system for imaging the fiducial mark.

The optical sensors 30 can be in various forms. In one embodiment, each sensor may comprise an optical fiber sensor. (Other sensing devices are described below.) A preferred optical fiber sensor comprises a coaxial optical fiber sensor having a monofilament optical fiber core, and a separate outer optical fiber tube made of a bundle of tiny optical fibers positioned around the periphery of the core. The monofilament optical fiber core can act either as a light emitter or receiver, and the outer peripheral optical fiber tube acts as the receiver for the emitter or vice versa. The emitter and receiver are insulated from each other, and an external imaging system sends a signal to one optical fiber conduit which produces an optical signal that reflects off the board. The other optical fiber conduit picks up the reflection from the board. The optical signal passes the fiducial marks and produces one type of reflection, whereas when the optical signal is centered on the fiducial marks, the reflections are interrupted and a different reflected light signal is sensed. Thus, the optical fiber and its imaging system acts as a transceiver to detect one type of light signal when there is misalignment with the fiducial mark and another type of light signal when alignment is produced.

Alternatively, the optical sensing device of the optical fiber type can comprise a pair of side-by-side optical fibers for emitting and receiving light signals to detect the position of the fiducial marks.

FIG. 9 illustrates another embodiment of a sensor 30 which comprises a pair of fiber optic probes 66 mounted to a fixture in alignment with fiducial marks on the board 20. The fiber optic probes are preferably flexible image conduits each comprising as many as 80,000 pixels, to transmit an image of the fiducial mark to the exterior of the fixture for further processing. The fixture in FIG. 9 also shows flexible optical fiber image conduits 68 transmitting images to remote display systems. In aligning the printed circuit board 20 to the fixture, the board is mounted on the tooling pins 24. The fiber optic probes 66 can be spring biased for spring-pressure contact with the underside of the board, or they can be used in combination with a lens system to focus on the fiducial marks on the board under test. Each of the tooling pins 24 is loosened, allowing the board to be moved manually relative to the fixture base and probes 18. This moves each fiducial mark relative to its corresponding optical sensor 30. Preferably, alignment is carried out by adjusting the position of one tooling pin until its related fiducial mark is properly aligned with a corresponding cross-hair (zero tolerance error reference point) on the monitor, and then adjusting the position of the other tooling pin to move its related fiducial mark into alignment with its related cross-hair. The external optical position detecting and imaging system can include retroreflective optical sensors for receiving external light signals conducted by the fiber optic probes. The underside of the board under test can be covered by a solder mask that reflects a given color of light picked up by the optical fiber sensors. The fiducial marks can be visible through the solder mask. The optical sensors on the external unit receive an external optical signal which is displayed in one color on the screen of a monitoring device from light reflected from the solder mask. When the fiducial marks are sensed by the optical fiber sensors (from movement of the board into the proper alignment position), the optical light signals change to a different color indicating alignment of the optical sensors with the respective fiducial marks. Alignment of each fiducial mark with a corresponding optical sensor is indicated on the imaging system, after which each tooling pin on the fixture is locked in a fixed position on the fixture base, for holding the board in its correctly aligned position.

In an alternative imaging system, a fiber optic probe 66 focuses on a fiducial mark and the opposite end of each optical probe is plugged into a second camera lens system used in displaying the fiducial mark on a remote monitor.

In another form of the invention, each optical sensor 30 can comprise a corresponding bore scope for producing a visual image of the location of the fiducial marks 28 relative to a known indexing mark produced by the external optical detecting and imaging system. The bore scope can be a type of optical detector using a matrix of optical fibers similar to pixels that form an image of an object in the field of view of the bore scope sensor. The bore scope is set at a fixed distance from the underside of the board because it has a fixed focal length lens to focus the light reflected from its field of view.

To properly align the board with the fixture, the board is placed on the tooling pins so that the board can be held at the correct set distance from each bore scope or other focusing optical device. The tooling pins are loosened at first so that the board can be moved manually relative to the fixture when the bore scope or other optical device is used for sighting the fiducial marks on the board. (The rectangular gasket 14 on which the board rests has sufficient clearance to allow shifting of the board relative to the top plate 16 and the probe field.) The board is then aligned using the imaging system which is best understood by referring to FIGS. 7 and 8. Each fiducial mark 28 is viewed through an eyepiece 54 which displays a cross-hair or other fixed zero reference indication generated in the optical display system. When the board is moved to position the fiducial mark close to the field of view, the bore scope or other optical device picks up the image of the fiducial mark which can be viewed in the eyepiece in reference to the fixed zero reference mark. The fiducial mark and the fixed reference mark can be enlarged and displayed on the screen of a video monitor 56 for use in accurately positioning the board on the fixture. The image enlarging and display system can include an image adapter 58 which senses the visual output from each eyepiece and adapts the images from both bore scopes into a display showing each fiducial mark in relation to its corresponding fixed zero reference cross-hair. The output from the image adapter is applied to a video enlarger 60 for enlarging the image of each reference cross-hair with its corresponding fiducial mark. An external camera 62 receives the image enlarger output for transmission to the video display terminal 56. FIG. 8 illustrates the video output on a screen of the video unit 56 which includes the enlarged image of a fiducial mark 28 detected by the optical sensor 30 in relation to a fixed zero reference cross-hair 64 in the imaging system.

By moving the circuit board relative to the fixture via the movable tooling pins, the position of each fiducial mark can be aligned with respect to its corresponding fixed reference mark 64. The screen of the video unit 56 can be observed as each tooling pin is manually moved through its 360° freedom of rotation until the fiducial marks on the board and the two sets of cross-hairs are properly registered. Each tooling pin is then locked in place on the fixture to automatically and precisely align the test points of the circuit array on the board with the test probes 18 on the fixture. The display shown in FIG. 8 is duplicated on a separate monitor for each fiducial mark and its related zero reference cross-hair. The board is moved while simultaneously monitoring all displays until all fiducial marks are aligned.

There are several possible means for setting the imaging system's fixed reference mark (the cross-hair 64), at a known zero position that will automatically align the test probes with the circuit array on the board when the image of the fiducial mark on the board is aligned with the image of the cross-hair reference. The preferred procedure is to use the calibration board, also referred to previously as a "gold board," which represents a zero alignment error when mounted to the test fixture. The gold board generates a zero alignment error with the test probes when tooling pins at diagonally opposite corners of the gold board are fitted into corresponding holes located on the test fixture at known fixed positions relative to the probe field. The external imaging system contains an electronically adjustable cross-hair generator to align separate cross-hairs with the reference marks or pins on the gold board so that zero alignment error is produced within the imaging system. This zero tolerance error is then calibrated electronically into the cross-hair imaging system. During testing, the gold board is replaced with each board under test, and enlarged images of the fiducial marks on a board being tested are displayed. The tooling pins on the fixture are loosened and each board is then moved to a position that will align its fiducial marks with the fixed reference cross-hairs set by the calibration system, to automatically align each board to the probe field on the fixture.

The image adapter is preferably arranged to display each tooling pin position reference with respect to a corresponding fiducial mark, as depicted in FIG. 8, in which case a separate monitor is used for each fiducial mark alignment; or a split screen arrangement can be used in which both sets of reference cross-hairs and fiducial marks are displayed on one screen.

FIGS. 10 and 11 illustrate a further embodiment of an optical sensor and alignment system in which each optical sensor 30 comprises a separate miniature camera lens and video probe assembly 70 mounted to the fixture, adjacent the probe field, for viewing toward the board under test. The separate camera lens and video probe assemblies each are removably mounted to the fixture base. Each assembly includes a lens, optical fiber image conduit, light source, video camera, image enlarging lens and connection to an external video monitor, all of which are removable from the fixture base. This arrangement enhances interchangeability with other fixtures.

Each camera lens and video probe assembly 70 includes a narrow cylindrical camera lens and optical fiber image conduit 72 mounted to a video camera 74. The image conduit 72 is comprised of a bundle of thousands (in one embodiment, 80,000) pixels or optical fibers in a manner similar to the optical probes 66 described previously. The lens and image conduit 72 are mounted in an elongated tubular video probe receptacle 76 affixed to the fixture base 25. The camera lens, optical conduit and video probe assembly extends downwardly under the base 25 of the fixture and into a hollow interior region 78 of the fixture housing. The camera lens, optical conduit and video probe assemblies mount to diagonally opposite corners of the base for alignment with corresponding fiducial marks on the underside of the board under test. The optical fiber image conduit 72 of each video probe and its corresponding lens are aligned with a separate enlarged hole 80 in opposite corners of the probe panel 16, for focusing on corresponding fiducial marks on the board. FIG. 11 illustrates how the fixture base 25 can pivot to an open position to gain access to the hollow interior region 78 of the fixture housing for mounting the camera and video probe assemblies in the receptacles 76 affixed to the base.

The fixturing arrangement shown in FIGS. 10 and 11 represents one embodiment in which the camera lens and video probe assemblies 70 are mounted inside the fixture housing, below the circuit board under test. The fixturing arrangement shown in FIG. 9 represents an alternative embodiment in which the camera lens and video probe assemblies may be remotely located from the fixture (because of space limitations), in which case the flexible optical fiber image conduits extend remotely away from the fixture for coupling to corresponding camera probes.

FIGS. 12 and 13 best illustrate the detailed construction of the camera lens and video probe assembly 70. The front of the optical fiber image conduit 72 has a double convex lens assembly 82 mounted in an opaque shield tube 84. A steel tube spacer 86 mounted behind the double convex lens provides an F-stop for the lens in focusing the image on the optical fiber image conduit. The lens assembly and optical fiber image conduit are mounted in an upright opaque lens tube 88 held in an opening through a lens mount 90 at the front of a video camera housing 92. The outer lens tube 91 carries a lock nut 93 used for in removably mounting the lens and video probe assembly to the video probe receptacle 76 on the base. (Alternatively, the receptacle that holds the video probe to the fixture can removably snap-lock into position, with a detent that automatically orients the optical system rotationally so that movement of the board is translated into corresponding movement of the fiducial mark on the monitor.) The tubular receptacle 76 on the fixture base contains a tubular opaque fiber optic conduit 91 which surrounds and parallels the long lens tube 88. The two tubes are coaxially aligned, leaving an open annular space between the inner tube 82 and the tubular outer fiber optic conduit 91. A plurality of flexible optical fibers 94 (in one embodiment, 56 separate optical fibers) extend through the annular space inside the conduit 91, from near the front of the lens tube to a lamp housing 96 on the video probe housing 92. A lamp 98 is mounted in a lamp holder in a cavity in the housing 92. The optical fibers 94 are directed from the annular space within the coaxial tubes into the cavity within the lamp housing for illumination from the light source. This is represented schematically at 98 in FIG. 12. The optical fibers 94 transmit the light from the lamp to the tip of the camera lens for forming an optical fiber ring 100 (see FIG. 13) which surrounds the lens system of the camera. The optical fiber ring produces a source of illumination for lighting the surface of the board 16, which can be a board under test or the gold board used for calibrating fixture alignment. The camera lenses 82 focus on the fiducial mark and produce an enlarged image of the fiducial mark on the optical fiber image conduit, along an optical axis 101 through the camera lens tube 88. Alternatively, the optical fiber image conduit 72 can be replaced with a relay lens system for optically transmitting an image of the fiducial mark to the video camera.

Figure 14:
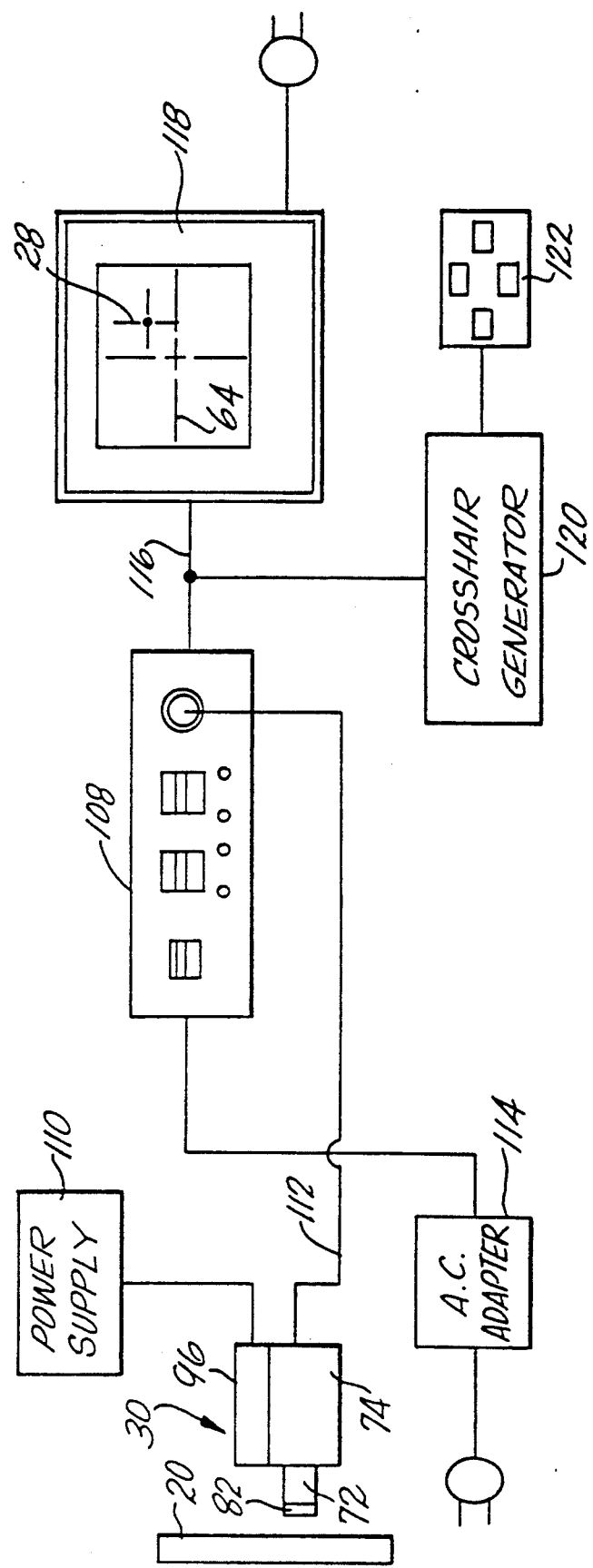
FIG. 14 is a schematic functional block diagram illustrating electronic components of the test fixture alignment imaging system.

The video probe 74 includes a pair of lenses 102 and 104 mounted in a tube 105 on the optical axis 101 extending from the opening to the camera lens assembly, through the optical fiber image conduit 72 and lens mount 90, and into the housing 92 of the video camera. The tube 105 is threaded for adjusting the position of the lenses on the lens mount 90 to control the distance between the camera lens 82 and the lenses 102 and 104. The lenses 102 and 104 in the video camera comprise an achromatic lens and a lens to correct for color aberrations. The lens pair receive the enlarged image of the fiducial mark from the optical fiber image conduit and produce an essentially 1:1 image focused on a charge-coupled device (CCD) chip 106 contained in the video probe unit. The CCD chip converts the image from the video lenses into digital information processed by a video display system shown in FIG. 14. The digital signals from the CCD chip are sent to a camera controller unit (CCU) 108 shown in FIG. 14 which also schematically illustrates the camera lens 82 and optical fiber image conduit 72, the video camera 74, and the fiber optic lamp housing 96 with a power supply 110 powering the fiber optic light source. A camera cable 112 transmits digital signals from the CCD chip in the video camera to the camera controller unit (CCU) 108. The video CCU 110 can be a unit such as the EC-202 or EM-102 sold by Elmo of Japan. The CCU is powered by a conventional AC power source through an AC adapter 114 such as the Elmo AC-E12 adapter. A coaxial video cable 116 from the CCU transmits video signals to a TV monitor 118. The camera lens and video probe produce an enlarged image of the fiducial mark 28 on the display screen of the TV monitor 118. Separately, the output of a cross-hair generator 120 is electronically coupled to the video cable 116 for superimposing a video image of the cross-hair 64 on the TV monitor. A cross-hair position controller 122 controls the position of the cross-hair on the monitor. The video camera and display system illustrated in FIG. 14 is repeated for each separate reference point or fiducial mark sensed on the circuit board. This arrangement includes a separate TV monitor for each video probe. Separately, a split screen can be used to simultaneously display fiducial marks and their related cross-hair reference.

In using the video camera system for aligning a circuit board to the probe field on the fixture, the fixture is first calibrated with the gold board. The video cameras are powered, and the video system produces enlarged video images of the gold pins that represent each one of the gold board's fiducial marks. Each cross-hair display is adjusted until the video images show the gold pins in alignment with the cross-hairs displayed on the monitors. The gold board is then removed, and circuit boards are tested one at a time on the fixture, with each fiducial mark on the board being displayed on a video monitor. If a fiducial mark is misaligned relative to its cross-hair image, the tooling pin positions are simply adjusted while moving the board relative to the probe field until the fiducial mark images come into alignment with the cross-hairs. The board is then precisely aligned to the probe field on the fixture.

The video camera alignment system produces a highly accurate means of adjusting circuit boards because alignment can be done rapidly. Since very minute position adjustments of the board are translated into greatly enlarged visual image position adjustments, board alignment is highly accurate. The miniature video camera assemblies can be part of a basic fixturing system which includes the fixture housing and the video display and monitor. Only a new probe plate and top plate need to be drilled for each board being tested, along with forming a gold board to calibrate the alignment. The camera assemblies then mount to the receptacles in the probe plate. The entire lens and video probe system for forming an enlarged image of the fiducial mark is removed from or mounted to the base.

Figure 15:
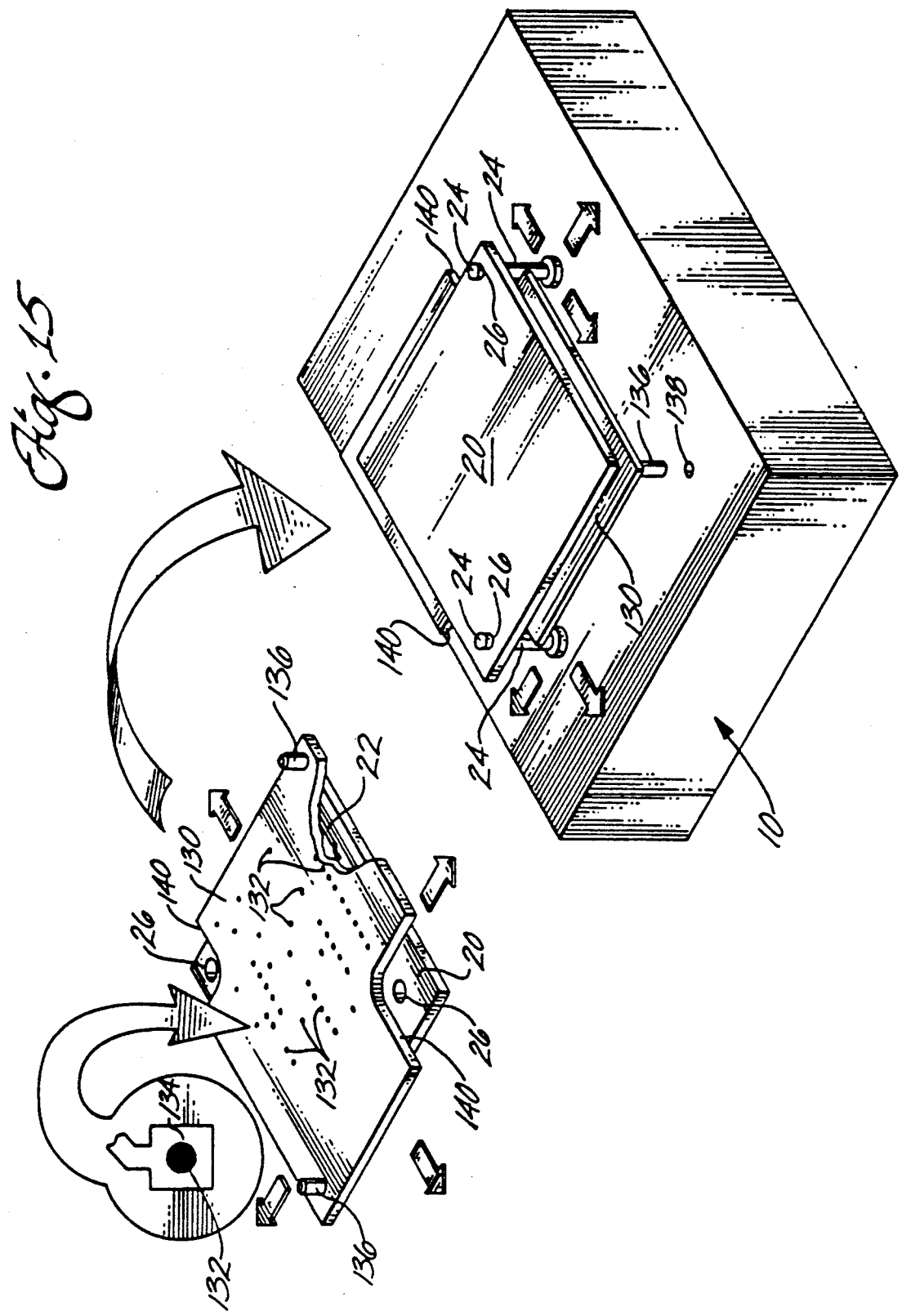
FIG. 15 is a perspective view illustrating an alternative technique for aligning a circuit board with a test fixture.

FIG. 15 shows another embodiment of the invention which provides a system for aligning circuit boards to the test fixture without use of the optical sensing means and means for producing enlarged images of a fiducial mark and a cross-hair or other zero reference point. In the illustrated system, an indexing or reference board 130, similar to the gold board described previously, is produced to represent a board perfectly aligned to the test fixture. The reference board 130 has a pattern of indexing marks 132 representing locations of the test points in the circuit array on a board under test. A circuit board 20 to be tested is aligned with the reference board so that test points 134 in the circuits on the board under test are matched to or overlie the test points 132 printed on the reference board. Preferably, the reference board is transparent so that the test points of the board 20 can be viewed through the reference board to align the test points 132 of the reference board with the corresponding test points 134 of the circuits on the board under test. The two overlying boards are then affixed to one another to prevent relative movement between them. The reference board also has tooling pins 136 or other alignment means related accurately to the test points 132 on the reference board. The reference board tooling pins are positioned accurately on the reference board so that when the tooling pins 136 are aligned with tooling pin holes 138 in the fixture, the reference board alignment will represent a circuit board accurately aligned to the field of test probes on the fixture. The reference board also includes cut out regions 140 in diagonally opposite corners that correspond to location of the movable tooling pins 24 on the fixture. The left side of FIG. 15 shows the transparent reference board 130 overlaid on a circuit board 20 being tested, in which the test points 132 of the reference board are visually aligned with corresponding test points 134 in the circuits on the board under test. When the two boards are perfectly aligned and the two boards are fastened together to prevent relative movement, the two boards are then flipped over and mounted to the fixture as shown in the right side of FIG. 15 (in which the circuit board 20 and the reference board 130 are shown separated for clarity). The reference board is mounted to the fixture by inserting the tooling pins 136 of the reference board in the correctly aligned tooling pin holes 138 in the fixture. If there is any misalignment between the tooling pin holes 26 of the board under test and the artwork on the board, then the tooling pins 24 in the fixture will not accurately register with the tooling pin holes 26 on the board under test. In this event, the tooling pins 24 are loosened and moved to positions which will correctly register the tooling pins 24 with the tooling pin holes 26. The cut out regions 140 provide clearance for moving the tooling pins 24 to their aligned positions. After the circuit board is aligned to the test fixture, the reference board 130 can be removed, and all boards within the same lot can then be tested on the test fixture using the same tooling pin positions.

What is claimed is:

1. A test fixture for testing a printed circuit board and the like, the test fixture being of the type having an array of test probes held in contact with a pattern of test points in a printed circuit array on the board, the circuit array being positioned on the board with reference to a fiducial mark on the board, the board also having an alignment device positioned thereon in alignment with the circuit array, the test fixture including:
    a tooling pin on the fixture for engaging the alignment device on the board to hold the board and its circuit array in a fixed position relative to an array of test probes on the fixture;
    sensing means having a fixed position on the fixture for sensing the position of the fiducial mark on the board to produce an output representative of the alignment or misalignment of the array of test probes relative to the circuit array on the board; and
    means for rigidly securing the tooling pin in a first position for holding the board in a fixed position for producing said output from the sensing means, the tooling pin being movable relative to the fixed position of the sensing means to move the board relative to the array of test probes to a second adjusted position to correct any misalignment of the circuit array relative to the array of test probes, the sensing means producing said output to indicate the precise movement of the board to the second adjusted position on the fixture necessary to align the sensing means with the fiducial mark to thereby indicate precise alignment of the test probes with corresponding test points in the circuit array on the board.

2. Apparatus according to claim 1 including means for locking the tooling pin in its adjusted position on the fixture for holding the board in a corrected position to register the test probes with the test points of the circuit array during a subsequent diagnostic circuit test of the circuits on the board.

3. Apparatus according to claim 1 in which the alignment device comprises a tooling pin hole drilled in the board.

4. Apparatus according to claim 1 in which the sensing means comprises an optical fiber sensor for producing an image of the fiducial mark.

5. Apparatus according to claim 4 in which the optical fiber sensor includes a lens, and further including a video probe assembly responsive to an image formed by the lens for displaying an enlarged image of the fiducial mark on a video monitor.

6. Apparatus according to claim 1 in which the sensing means comprises a lens system and video probe, and said output is produced by means converting an image of the fiducial mark to an enlarged video image representative of said alignment or misalignment.

7. Apparatus according to claim 6 in which an enlarged image of the fiducial mark is displayed on a video monitor for comparison with an adjustable indexing mark electronically produced on the monitor to indicate the correct alignment position of the probes relative to the circuit array.

8. Apparatus according to claim 1 wherein said securing means comprise a tooling pin mounting hole in the fixture adapted to provide substantially 360° freedom of movement of the tooling pin relative to the sensing means on the fixture, and locking means adapted to hold the tooling pin in a fixed adjusted position on the fixture in the tooling pin hole.

9. Apparatus according to claim 8 in which the tooling pin is threaded into locking means comprising a locking nut, and means for preventing relative rotation between the nut and the fixture as the tooling pin is rotated to tighten it into the locking nut.

10. Apparatus according to claim 1 in which the sensing means comprises an image focusing and enlarging means which are removably mounted to a fixed position on the fixture.

11. A test fixture for testing a printed circuit board and the like, the test fixture being of the type having an array of test probes held in contact with a pattern of test points in a printed circuit array on the board, the circuit array being positioned on the board with reference to a fiducial mark on the board, the board also having an alignment device positioned thereon in alignment with the printed circuit array, the test fixture including:
    a tooling pin on the fixture for engaging the alignment device on the board to hold the board and its circuit array in a fixed position relative to an array of test probes on the fixture;
    optical fiber sensing means mounted in a fixed position on the fixture for sensing the fiducial mark on the board and producing an image that represents the position of the fiducial mark;
    means for producing a fixed reference point that represents a fixed reference position with which the image of the fiducial mark position can be aligned to thereby register the array of test probes with the pattern of test points on the board; and
    means for rigidly securing the tooling pin in a first position for holding the board in a fixed position for producing said image that represents the position of the fiducial mark, the tooling pin being movable relative to the fixed position of the sensing means to move the board relative to the array of test probes to a second adjusted position to align the image of the fiducial mark with the fixed reference point and thereby align the array of test probes with the pattern of test points in the circuit array on the board.

12. Apparatus according to claim 11 in which the optical fiber sensing means includes:
    a lens for forming an image of the fiducial mark, and an optical fiber image conduit for transmitting the image, the lens and image conduit being removably mounted to the fixture; and including video means responsive to the transmitted image for displaying an enlarged image of the fiducial mark relative to the fixed reference point for indicating correct aligned position of the test points relative to the test probes.

13. Apparatus according to claim 12 in which the optical fiber sensing means further includes an optical fiber ring surrounding the optical fiber conduit and lens for illuminating the fiducial mark.

14. Apparatus according to claim 11 wherein said securing means includes a tooling pin mounting hole in the fixture adapted to provide substantially 360° freedom of movement of the tooling pin relative to the sensing means on the fixture, and locking means adapted to hold the tooling pin in a fixed adjusted position on the fixture in the tooling pin hole.

15. Apparatus according to claim 11 in which the means for producing the fixed reference point comprises means for forming an adjustable image electronically produced on a monitor to indicate correct alignment of the probes relative to the circuit array on the board.

16. A test fixture for testing a printed circuit board, the test fixture comprising:
    a base;
    an array of test probes on the base to be aligned with a pattern of test points in a circuit array on the board, the circuit array being positioned on the board with reference to one or more indexing marks on the board;
    board mounting means on the base for holding the board in a fixed position relative to the array of test probes on the base;
    sensing means in a fixed position on the base for sensing the position of the indexing mark on the board as the board is held on the base by the board mounting means to produce a measurement of the alignment or misalignment of the array of test probes relative to the pattern of test points in the circuit array on the board; and
    means for rigidly securing the board mounting means in a first position for holding the board in a fixed position to produce said sensing means measurement, the board mounting means being movable relative to the fixed position of the sensing means to move the board relative to the array of test probes to a second adjusted position to produce a corresponding change in said sensing means measurement to thereby indicate the change in position of the board relative to the base necessary to correctly align the pattern of test points in the circuit array with the array of test probes.

17. Apparatus according to claim 16 in which the sensing means comprise an optical fiber sensor and a visual display responsive to an optical fiber sensor output for producing a visual display of said measurement.

18. Apparatus according to claim 16 in which the sensing means comprise:
    a camera lens and video probe assembly; and
    means responsive to an output of the video probe assembly for producing a visual reading of said measurement; and in which the visual reading is produced by means converting an output of the video probe to a video image representative of said alignment or misalignment.

19. Apparatus according to claim 18 in which the camera lens and video probe are removably mounted to the fixture base.

20. Apparatus according to claim 16 in which an enlarged image of the indexing mark is displayed on a video monitor for comparison with an electronically adjustable indexing mark produced on the monitor to indicate the correct alignment position of the probes relative to the circuit array.

21. A test fixture for testing a printed circuit board and the like, the test fixture being of the type having an array of test probes held in contact with a pattern of test points in a printed circuit array on the board, the circuit array being positioned on the board with reference to a fiducial mark on the board, the board also having an alignment device positioned therein in alignment with the circuit array, the test fixture including:
    a tooling pin on the fixture for engaging the alignment device on the board to hold the board and its circuit array in a fixed position relative to an array of test probes on the fixture;
    means for sensing the position of the fiducial mark to produce an output representative of the alignment or misalignment of the array of test probes relative to the circuit array on the board; and
    means for locking the tooling pin in a first position on the fixture for holding the board in a fixed position for producing said output from the sensing means, and means for unlocking the tooling pin so the tooling pin is movable to a second adjusted position on the fixture to correct any misalignment of the circuit array relative to the array of test probes, the sensing means producing said output to indicate the precise movement of the tooling pin to the second adjusted position on the fixture necessary to align the sensing means and the fiducial mark to thereby indicate precise alignment of the test probes with corresponding test points in the circuit array on the board;
    the locking means being movable from its unlocked to its locked position to a locked position for rigidly securing the tooling pin in its adjusted second position on the fixture for holding the board in the corrected position to register the test probes with the test points of the circuit array during a subsequent diagnostic circuit test of the circuits on the board.

22. Apparatus according to claim 21 in which the means for unlocking the tooling pin includes a tooling pin mounting hole in the fixture, in which the tooling pin is mounted in the mounting hole, the mounting hole providing substantially 360° freedom of movement of the tooling pin relative to the fixture and the sensing means on the fixture, and the locking means is adapted to hold the tooling pin in a fixed adjusted position in the tooling pin hole.

23. Apparatus according to claim 22 in which the tooling pin is threaded into locking means comprising a locking nut, and means for preventing relative rotation between the nut and the fixture as the tooling pin is rotated to tighten it into the locking nut.

24. A test fixture for testing a printed circuit board and the like, the test fixture being of the type having an array of test probes held in contact with a pattern of test points in a printed circuit array on the board, the circuit array being positioned on the board with reference to a fiducial mark on the board, the board also having an alignment device positioned thereon in alignment with the printed circuit array, the test fixture including:
    a tooling pin on the fixture for engaging the alignment device on the board to hold the board and its circuit array in a fixed position relative to an array of test probes on the fixture;

optical fiber sensing means mounted in a fixed position on the fixture for sensing the fiducial mark on the board and producing a first image that represents the position of the fiducial mark;

means for producing a second image of a fixed reference point that represents a fixed reference position with which the fiducial mark position can be aligned to correctly register the array of test probes with the pattern of test points on the board; and means for locking the tooling pin on the fixture to thereby hold the board in a fixed first position when producing said first image and means for unlocking the tooling pin to move the board relative to the fixture to align the fist and second images and thereby align the array of test probes with the pattern of test points, the tooling pin being mounted in a tooling pin mounting hole in the fixture, and in which the mounting hole provides substantially 360° freedom of movement of the tooling pin relative to the fixture and the sensing means on the fixture, the locking means being adapted to hold the tooling pin in a fixed adjusted position in the tooling pin hole on the fixture.

25. A test fixture for testing a printed circuit board and the like, the test fixture being of the type having an array of test probes held in contact with a pattern of test points in a printed circuit array on the board, the circuit array being positioned on the board with reference to a fiducial mark on the board, the board also having an alignment device positioned thereon in alignment with the printed circuit array the test fixture including:

a tooling pin on the fixture for engaging the alignment device on the board to hold the board and its circuit array in a fixed position relative to an array of test probes on the fixture;

optical fiber sensing means mounted in a fixed position on the fixture for sensing the fiducial mark on the board and producing a first image that represents the position of the fiducial mark;

means for producing a second image that represents a fixed reference point with which the image of the fiducial mark position can be aligned to correctly register the array of test probes with the pattern of test points on the board; and electrical control means for forming the second image on a monitor and for adjusting the position of the second image on the monitor to indicate a calibrated correct alignment of the test probes relative to the circuit array on the board;

the tooling pin being rigidly held in a first position to hold the board in a fixed position when producing said first image, the tooling pin being movable to a second adjusted position to thereby move the board relative to the fixture to align the first and second images and thereby correctly align the array of test probes with the pattern of test points.

26. A test fixture for testing a printed circuit board and the like, the test fixture being of the type having an array of test probes held in contact with a pattern of test points in a printed circuit array on the board, the circuit array being positioned on the board with reference to a fiducial mark on the board, the board also having an alignment device positioned thereon in alignment with the circuit array, the test fixture including:

a tooling pin on the fixture for engaging the alignment device on the board to hold the board and its circuit array in a fixed first position relative to an array of test probes on the fixture;

sensing means having a fixed position on the fixture for sensing the position on the fiducial mark to produce an output representative of the alignment or misalignment of the array of test probes relative to the circuit array on the board; and electrical control means for producing an image on a monitor of a fixed reference point that represents a fixed reference position with which the fiducial mark positioned can be aligned to register the array of test probes with the pattern of test points on the board, the electrical control means including means for adjusting the position of the image on the monitor to indicate a calibrated correct alignment of the test probes relative to the test points in the circuit array on the board;

the tooling pin being movable relative to the fixed position of the sensing means to move the board relative to the fixture to a second adjusted position to correct any misalignment of the circuit array relative to array of test probes, the sensing means producing said output to indicate the precise movement of the tooling pin to the second adjusted position on the fixture necessary to align the sensed fiducial mark with the correctly aligned fixed reference point to thereby indicate precise alignment of the test probes with corresponding test points in the circuit array on the board.

27. A test fixture for testing a printed circuit board, the fixture comprising:

an array of test probes held in contact with a pattern of test points in a printed circuit array on the board, the circuit array being positioned on the board with reference to at least a pair of fiducial marks spaced apart on the board;

board mounting means on the fixture for holding the board in a fixed position relative to the fixture;

separate optical image conduits mounted in fixed positions spaced apart on the fixture for producing an image of each fiducial mark on the board held by the board mounting means;

video means aligned with each optical image conduit for producing separate enlarged video images of each fiducial mark on a video monitor when the board is in said fixed position; and electrical control means for independently adjusting the positions of corresponding fixed reference points displayed on a video monitor for representing correct alignment of the test probes relative to the test points on the board;

the position of the board mounting means on the base being adjustable to move the printed circuit board relative to the fixture and relative to the fixed positions of the optical image conduits thereon to move the board to a corrected position to thereby move the images of the fiducial marks into alignment with said corresponding fixed reference points, thereby aligning the test points on the board with corresponding test probes on the fixture.

28. Apparatus according to claim 27 in which the video means includes a video camera and a video cable for transmitting electronic video image signals from each video camera to a video monitor, and a separate reference point generator having a signal input to the video cable for superimposing an image of the reference point on the video monitor for adjustable alignment with the image of the fiducial mark produced by the video camera.

29. A test fixture for testing a printed circuit board and the like, the test fixture being of the type having an array of test probes held in contact with a pattern of test points in a printed circuit array on the board, the circuit array being positioned on the board with reference to a fiducial mark on the board, the board also having an alignment device positioned thereon in alignment with the printed circuit array, the test fixture including:
- a tooling pin on the fixture for engaging the alignment device on the board to hold the board and its circuit array in a fixed position relative to an array of test probes on the fixture;
- optical fiber sensing means mounted in a fixed position on the fixture for sensing the fiducial mark on a board held by the tooling pin and producing an image that represents the position of the fiducial mark; and
- electrical control means for producing a fixed reference point that represents a fixed reference position with which the image of the fiducial mark can be aligned to correctly register the array of test probes with the pattern of test points on the board, including means for adjusting the position of the fixed reference point to indicate a calibrated correct alignment of the test probes relative to the test points in the circuit array on the board;
- the position of the tooling pin on the fixture being adjustable relative to the fixed position of the optical fiber sensing means thereon to move the board relative to the fixture to a corrected position to thereby align the image of the fiducial mark with the fixed reference point and thereby align the test probes with the pattern of test points.

30. Apparatus according to claim 29 in which the optical fiber sensing means includes a video camera having a video cable connected to a video monitor for transmitting a video image of the fiducial mark to the monitor, and the control means for producing the reference point comprises a reference point generator electronically coupled to the video cable for superimposing on the monitor a video image of the fixed reference point.

31. A test fixture for testing a printed circuit board and the like, the test fixture being of the type having an array of test probes held in contact with a pattern of test points in a printed circuit array on the board, the circuit array being positioned on the board with reference to a fiducial mark on the board, the board also having an alignment device positioned thereon in alignment with the printed circuit array, the test fixture including:
- a base on which the array of test probes are mounted;
- board mounting means for engaging the alignment device on the board for holding the board and its circuit array in a fixed position relative to the array of test probes on the base;
- sensing means on the base for producing an image of the position of the fiducial mark; and
- electrical control means for setting a fixed reference point to a position on a monitor representing correct alignment of circuits on the board relative to the test probes;
- the position of the board mounting means being adjustable relative to the fixture base to move the board relative to the base and thereby cause the image of the fiducial mark produced by the sensing means to move relative to the fixed reference point on the monitor so that alignment of the fiducial mark image with the fixed reference point represents correct alignment of the circuits on the board with the test probes on the base.

32. Apparatus according to claim 31 in which the sensing means comprises an optical fiber sensor for conveying an image of the fiducial mark and video probe means for producing an enlarged image of the fiducial mark on a video display monitor.

33. Apparatus according to claim 32 in which the electrical control means are connected to the video probe means for superimposing the fixed reference point and the fiducial mark image on the video monitor.

34. Apparatus according to claim 33 in which the board mounting means comprises a tooling pin mounted to the fixture base and means for shifting the position of the tooling pin connection to the base relative to a fixed position of the sensing means thereon for causing relative movement between the image of the fiducial mark and the fixed reference point.

35. Apparatus according to claim 31 in which the electrical control means includes means for generating the image of the fixed reference point on a monitor and for adjusting the position of the fixed reference point image on the monitor for calibrating the position of the fixed reference point relative to a circuit board fiducial mark image having a known correct position with respect to the probes on the fixture base.

* * * * *

UNITED STATES PATENT AND TRADEMARK OFFICE
CERTIFICATE OF CORRECTION

PATENT NO. : 5,321,351

DATED : June 14, 1994

INVENTOR(S) : Mark A. Swart; Charles J. Johnston; David R. Van Loan

It is certified that error appears in the above-indentified patent and that said Letters Patent is hereby corrected as shown below:

Column 4, line 64, after "along" insert -- line --.

Column 5, line 27, after "parallel" insert -- to --.

Column 7, line 40, after "plane" change "o" to -- of --.

Column 12, line 50, before "removably" delete "in".

Column 21, line 32, after "align" insert -- the array of --.

Signed and Sealed this

Second Day of May, 1995

Attest:

BRUCE LEHMAN

Attesting Officer

Commissioner of Patents and Trademarks